United States Patent [19]

Lin et al.

[11] Patent Number: 5,247,423
[45] Date of Patent: Sep. 21, 1993

[54] STACKING THREE DIMENSIONAL LEADLESS MULTI-CHIP MODULE AND METHOD FOR MAKING THE SAME

[75] Inventors: Paul T. Lin; Michael B. McShane, both of Austin, Tex.

[73] Assignee: Motorola, Inc., Schaumburg, Ill.

[21] Appl. No.: 887,963

[22] Filed: May 26, 1992

[51] Int. Cl.$^5$ .............................. H05K 7/20
[52] U.S. Cl. ..................... 361/719; 174/252; 361/744; 361/749
[58] Field of Search ............... 257/706, 707, 723, 724; 174/252, 261, 254; 165/80.3, 185; 439/485, 66-69; 361/386-389, 396, 398, 403, 405, 409, 410, 412, 413, 421, 411

[56] References Cited

U.S. PATENT DOCUMENTS

| | | | |
|---|---|---|---|
| 3,304,468 | 2/1967 | Lawson | 361/396 |
| 3,428,954 | 2/1969 | David | 361/412 |
| 3,588,852 | 6/1971 | McCormack | 361/412 |
| 4,956,694 | 9/1990 | Eide | 361/396 |
| 5,016,138 | 5/1991 | Woodman | 361/396 |
| 5,155,661 | 10/1992 | Nagesh | 361/386 |
| 5,162,975 | 11/1992 | Matta | 361/386 |

OTHER PUBLICATIONS

"Large Capacity Memory Board Using Stacked Chip Assembly," by Kenzo Hatada et al., The Third Microelectronics Symposium (MES '89), Jul. 1989.
"Stacked High-Density Multichip Module," by R. A. Jarvela et al., IBM Technical Disclosure Bulletin, vol. 14, No. 10, Mar. 1972, pp. 2896-2897.

Primary Examiner—Gerald P. Tolin
Attorney, Agent, or Firm—James L. Clingan, Jr.

[57] ABSTRACT

A stackable three dimensional leadless multi-chip module (10) is provided whereby each level of semiconductor device (11) is interconnected to another level through reflowing of solder plated wires (22). Each semiconductor device (11) contains a semiconductor die (24) overmolded by a package body (12) on a PCB substrate (14) having a plurality of edge metal conductors (16) that form half-vias (18). The half-vias (18) at the edges of substrate (14) give the substrate a castellated appearance, where the castellations serve as the self-aligning feature during the stacking of the devices (11). Each device (11) is simply stacked on top of each other without any additional layers to give the semiconductor module (10) a lowest possible profile. A plurality of solder plated wires (22) fits into the half-vias (18) and is solder reflowed to the metal conductors (16) to interconnect the semiconductor devices (11). The wires (22) are bent to enable the module (10) to be surface mounted to a PC board.

12 Claims, 4 Drawing Sheets

5,247,423

STACKING THREE DIMENSIONAL LEADLESS MULTI-CHIP MODULE AND METHOD FOR MAKING THE SAME

CROSS-REFERENCE TO RELATED APPLICATION

Related subject matter is disclosed in U.S. patent application Ser. No. 07/844,075 by Paul T. Lin, entitled "Three-Dimensional Multi-Chip Pad Array Carrier," filed Feb. 28, 1992 and assigned to the assignee hereof.

FIELD OF THE INVENTION

The present invention relates to semiconductor devices in general, and more specifically to stackable three dimensional multiple chip modules.

BACKGROUND OF THE INVENTION

Most large scale integrated circuits (ICs) are presently packaged in plastic or ceramic packages with metal leads extended therefrom for soldering to a printed circuit (PC) board or for insertion into a socket. Typically, these IC packages are configured as dual-in-line or quad-flat packages. In most instances only a single IC is contained within a package, although multiple chips are sometimes contained within a package. The circuit density resulting from this packaging technology is not very great since the ceramic or plastic package consumes relatively large areas of the mounting surface, usually a printed circuit board, particularly if a socket is used.

Moreover, printed circuit (PC) boards are becoming smaller and denser. A compact packaging technology is needed when mounting area is limited dictating that circuit elements be closely spaced. PC boards have typically been designed so that semiconductor devices in the form of packaged semiconductor dice are mounted thereon to make a final circuit. For memory boards, the drive for increased memory capacity is limited by board space. Thus, when the size of the board is fixed, the number of devices that can possibly be mounted on the board is limited. A module consisting of a plurality of semiconductor devices is used to densely dispose semiconductor devices. Mounting to the PC board can be accomplished by a surface mount or a through-hole technique.

Several methods exist for fabricating a semiconductor multiple chip module. One such method uses a laminated cofired ceramic substrate, onto which bare semiconductor dice are directly attached to the ceramic mounting surface and are wire bonded to conductive areas on the mounting surface, or are inverted and connected directly to metallized areas on the ceramic mounting surface by, for example, a solder-bump technique. This multiple chip module technology has several limitations, however. Interconnecting multiple ICs on a single ceramic mounting surface requires deposition of a metallic material in a pattern which desirably avoids cross-overs. Furthermore, a disadvantage of direct chip attach is the difficulty of burn-in before module assembly. Burn-in is performed to screen out weak devices. If a module fails during burn-in due to a weak device, the entire module must be discarded or repaired after burn-in, whereas if each component of the module could be burned-in prior to module assembly, the yield for functional modules can be increased.

Another method of fabricating a semiconductor multiple chip module involves tape automated bonded (TAB) semiconductor dice to a flexible circuit leadframe. The semiconductor dice are tested as discrete units before being mounted, or they can be tested in the final circuit form after the TAB process. After testing and reworking, the flexible circuit leadframe is encapsulated. The dice and circuitry on the leadframe except outer portions of the leadframe are encapsulated in a mold forming a single package body for the entire module. The disadvantage to this approach is that repair of the module after encapsulation is not possible. Hence, any failure of a semiconductor die inside the encapsulated module would cause the entire module to be rejected.

Another approach to form a multiple chip module is to stack pin grid arrays (PGAs). A bottom substrate is provided with copper pins in a conventional manner. Semiconductor dice are then flip-chip mounted to chip carrier substrates. An interposer physically and electrically couples a chip carrier substrate to another chip carrier or to the bottom substrate by way of solder joining the interconnections. The copper pins of the PGAs and the interposers provide the stand-off between the carriers to keep them from collapsing onto each other. A limitation to stacked PGAs is the overall height of the module. The standoff from the copper pins and the interposers between each carrier increases the height of the module which is not desirable since PC board real estate in the Z-direction is becoming as precious as PC board real estate in the X-Y plane.

SUMMARY OF THE INVENTION

In accordance with the invention, there is provided a leadless semiconductor device having a thermally conductive flexible substrate and a semiconductor die. The thermally conductive flexible substrate has a top surface and a bottom surface. The flexible substrate also has a plurality of metal conductors on a first pair of opposing edges extending to the bottom surface, wherein the edge is castellated corresponding to the plurality of metal conductors to form a plurality of half-vias at the edge of the flexible substrate. The plurality of metal conductors is used to electrically connect the semiconductor device to a PC board. The flexible substrate also has a continuous pair of thermally conductive extensions formed by a second pair of opposing edges on the flexible substrate. The semiconductor die is mounted and electrically connected to the thermally conductive flexible substrate. The semiconductor die is directly overmolded on the flexible substrate with an encapsulating material which adheres to the flexible substrate forming a package body for the semiconductor die. These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Detailed Description of a Preferred Embodiment

Figure 1:
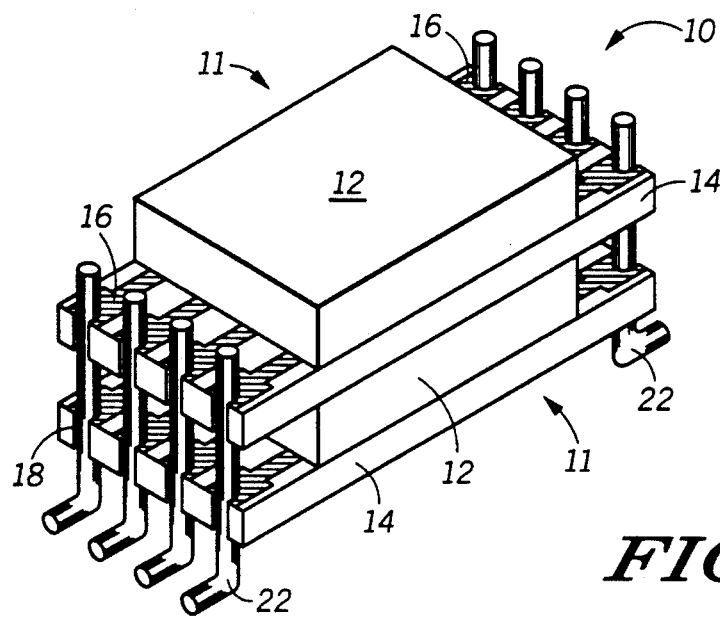
FIG. 1 is an oblique view of a stacked three dimensional leadless multiple chip module, a first embodiment of the present invention.

With the present invention, it is possible to manufacture a low cost three dimensional multiple chip module to densely package semiconductor devices without sacrificing PC board space in the X-Y plane. The invention enables a stacked leadless multiple chip module. Moreover, this invention provides a method for manufacturing such a module. In accordance with the invention an oblique view of a stacked three dimensional leadless semiconductor multiple chip module 10 comprising two semiconductor devices 11 each having a package body 12 on a PCB substrate 14 is illustrated in FIG. 1, a first embodiment of the present invention. The package body 12 can be of but not limited to any conventional encapsulating material, for example, an epoxy resin-based molding compound. Package body 12 can be formed either through overmolding or through a "glob top" process. Overmolding can be accomplished in a transfer mold, which is a common tool in the art. A "glob top" process is where an encapsulant is either dispensed or melted over a semiconductor die to cover it.

As further illustrated in FIG. 1, PCB substrate 14 has a plurality of metal conductors 16 extending past package body 12. Metal conductors 16 also extend to the bottom surface of PCB substrate 14. The advantage of semiconductor device 11 over conventional leaded packages is that the problem of lead damage is eliminated because metal conductors 16 perform substantially the same function as the external leads of conventional semiconductor packages, but metal conductors 16 are supported by a PCB substrate 14. Semiconductor device 11 can be tested and burned-in with a socket that makes contact with the plurality of metal conductors 16. Additionally, metal conductors 16 have semi-circular edges to form a plurality of half-vias 18 along the edges of PCB substrate 14 giving the edges a castellated appearance. The plurality of half-vias 18 enables electrical interconnections between multiple semiconductor devices 11 to form a multiple chip module. Also illustrated in FIG. 1 is a plurality of electrical conductors 22 that connect the two semiconductor devices 11.

Figure 2:
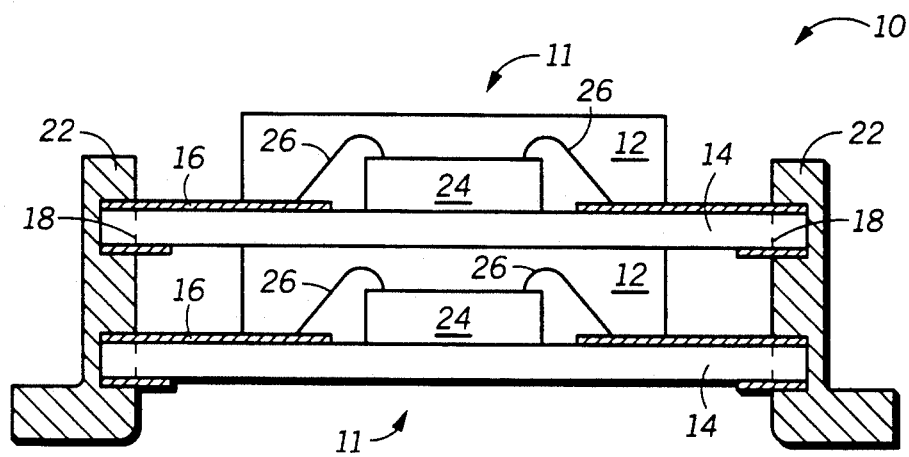
FIG. 2 is a cross-sectional view of the module of FIG. 1.

Illustrated in FIG. 2 is a cross-sectional view of FIG. 1. Electrical conductors 22 can be either solder plated wires or solder filled springs. A solder filled spring is basically a spring filled with solder that looks substantially like a solid column of solder. During solder reflow when the solder is melted, the coils of the spring prevent the solder from collapsing because the molten solder will wet to the spring due to surface tension.

As illustrated in FIG. 2, two semiconductor devices 11 are stacked above one another. Each semiconductor device 11 has a semiconductor die 24 directly mounted to PCB substrate 14. Each semiconductor die 24 is electrically connected to the plurality of metal conductors 16 by way of a plurality of wire bonds 26 as illustrated in FIG. 2. The wires are bonded selectively to the plurality of metal conductors 16 so that each device in the stack is not identical. This differentiation is needed for chip enable requirements in the module. In some cases, the chip enable for each device is interconnected, but in that instance, the data outputs per device cannot be interconnected. Thus, it should be apparent that each device in the stack have to be marked accordingly because of the different wire bonding scheme of each device.

As further illustrated in FIG. 2, the PCB substrates 14 are positioned such that the plurality of half-vias 18 of both semiconductor devices 11 are aligned to each other in the X-Y direction. The plurality of electrical conductors 22 fit into the plurality of half-vias 18 and are soldered thereto to electrically interconnect the semiconductor devices 11. Since each semiconductor device 11 is not identical in the wire bonding scheme, at least one of the plurality of electrical conductors 22 is unique per device. This uniqueness allows each device 11 to be selected during the multiple chip module's operation. The lower ends of the plurality of electrical conductors 22 are bent to enable the semiconductor multiple chip module 10 to be surface mounted to a PC board (not shown). Although FIG. 2 illustrates the plurality of electrical conductors 22 being bent outward, it is possible to bend the plurality of electrical conductors 22 inward and still enable surface mounting.

Figure 3:
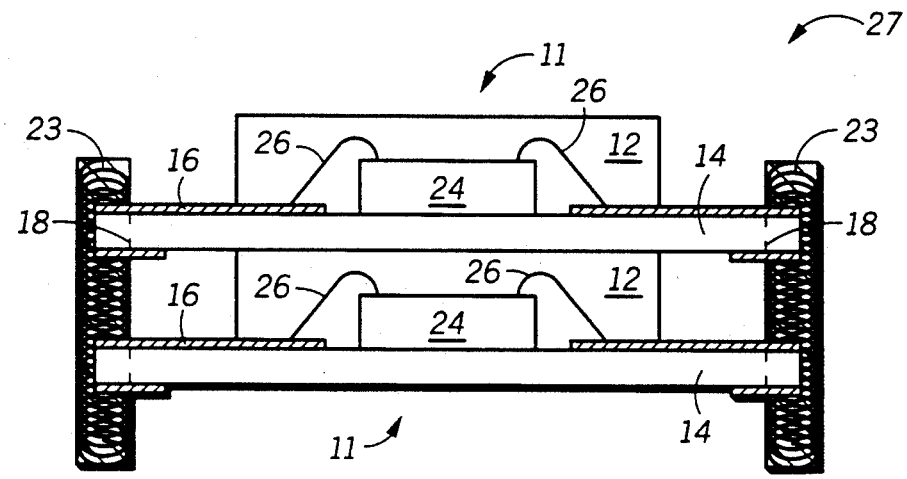
FIG. 3 is a cross-sectional view of a through-hole type stacked leadless three dimensional semiconductor multiple chip module, illustrating a second embodiment of the present invention.

FIG. 3 illustrates a second embodiment of the present invention. Semiconductor multiple chip module 27 has the same type of components as the module 10 of FIG. 2, and are thus labeled accordingly. The difference with the multiple chip module 27 is that the plurality of electrical conductors 23 in the form of solder filled springs; 22 are left straight to make the module 27 a through-hole type of module, as opposed to the surface mounting configuration of module 10 of FIG. 2.

For the embodiments illustrated in FIGS. 2 & 3, an alternative method for chip enable is offered if each device in the multiple chip module stack is desired to be wire bonded and marked identically. In the plurality of electrical conductors 22 or 23, the chip enable connection for each device can be sheathed with an electrical insulator in such a manner that no electrical contact is made with the other device. Thus, chip enable for each device can be achieved.

Figure 4:
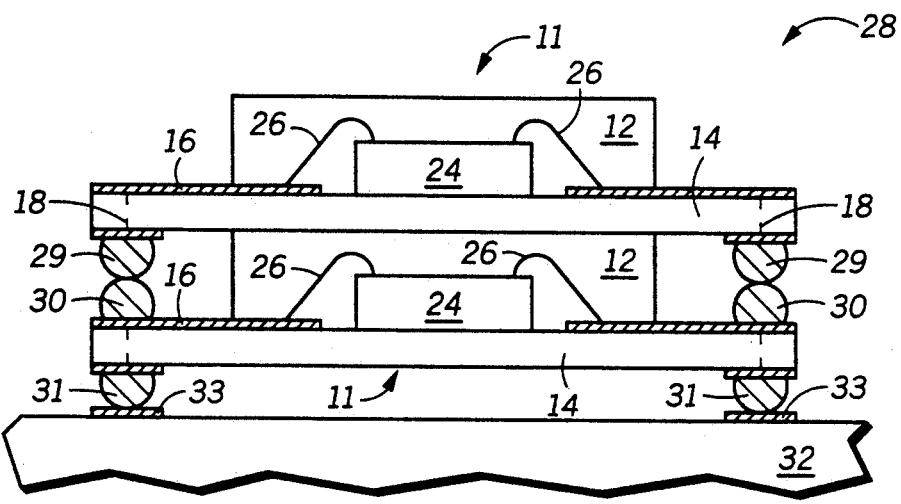
FIG. 4 is a cross-sectional view of a surface mountable stacked leadless three dimensional semiconductor multiple chip module using a plurality of solder balls on both top and bottom surfaces of the substrate of the lower device for interconnects, illustrating a third embodiments of the present invention.

FIG. 4 illustrates yet a third embodiment of the present invention. Again, semiconductor multiple chip module 28 has substantially the same type of components as the module 10 of FIG. 2, thus, the components are labeled the same where applicable. In this embodiment, the plurality of electrical conductors consists of solder balls 29 attached to the bottom surface of substrate 14 of the upper device, solder balls 30 attached to the upper surface of substrate 14 of the lower device, and solder balls 31 attached to the bottom surface of substrate 14 of the lower device. When the solder balls 29 and 30 are reflowed together, they form rigid interconnections between the upper and lower semiconductor devices 11 in the stack. The module 28 can be surface mounted to a PC board 32 by reflowing the plurality of solder balls 31 to solder pads 33 on the PC board 32.

Figure 5:
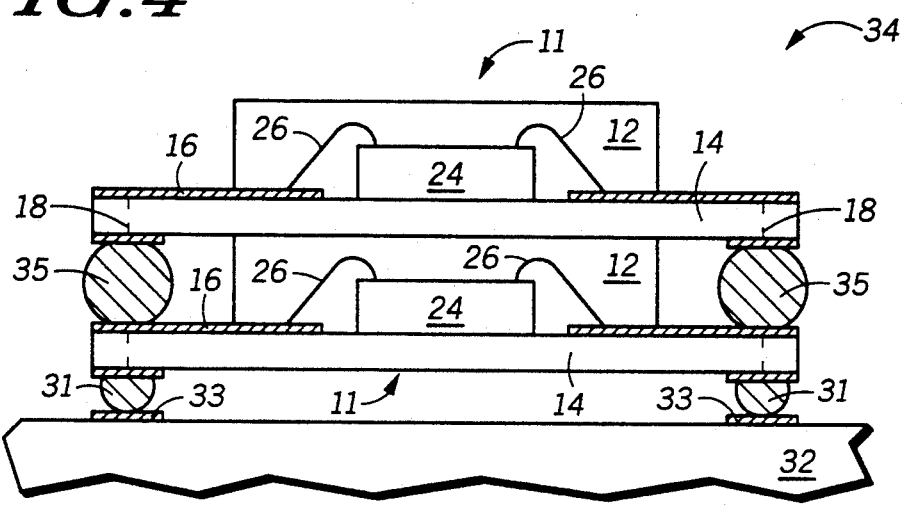
FIG. 5 is a cross-sectional view of a surface mountable stacked leadless three dimensional semiconductor multiple chip module using a plurality of solder balls for interconnects, illustrating a fourth embodiment of the present invention.

FIG. 5 illustrates a fourth embodiment of the present invention, having substantially the same components as semiconductor multiple chip module 28 of FIG. 4. Therefore, the components are labeled the same where applicable. Semiconductor multiple chip module 34 has a single layer of solder balls 35 to interconnect the upper and lower semiconductor devices 11. This configuration is possible when the diameter of the solder ball 35 is greater than the height of package body 12.

Figure 6:
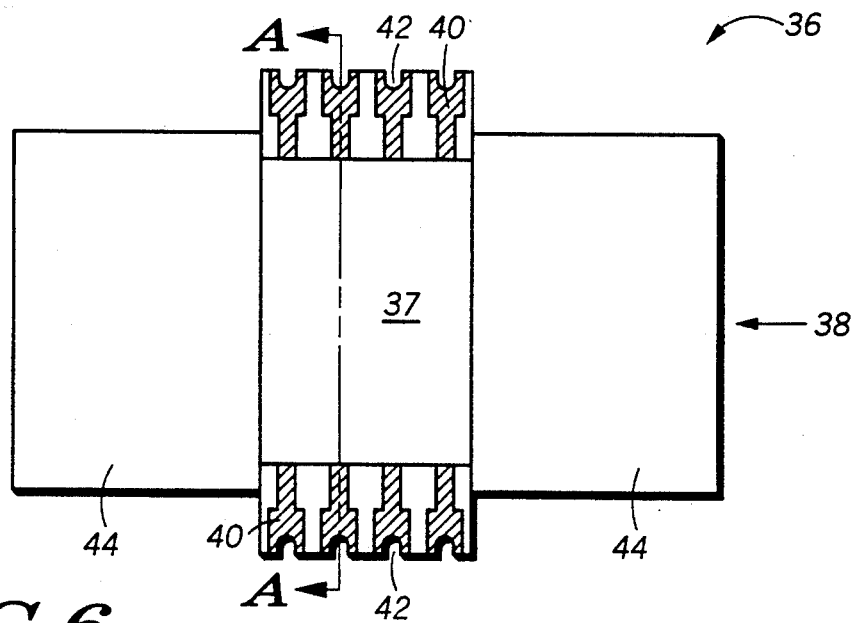
FIG. 6 is a top view of an overmolded semiconductor device on a thermally conductive flexible substrate with edge half-vias and a pair of thermally conductive extensions, illustrating a fifth embodiment the present invention.

Illustrated in FIG. 6 is a top view of a semiconductor device 36 that has an overmolded package body 37 on a flexible substrate 38, a fifth embodiment of the present invention. The overmolded package body 37 can be of but not limited to any conventional encapsulating material, for example, an epoxy resin-based molding compound. Flexible substrate 38 has a plurality of metal conductors 40 on two opposing sides extending past the package body 37 to the edges of flexible substrate 38. Metal conductors 40 are semi-circular in shape at the edges of the flexible substrate 38 to form a plurality of half-vias 42, giving those edges of the flexible substrate 38 a castellated appearance. Furthermore, metal conductors 40 also extend from the top surface of flexible substrate 38 to the bottom surface of flexible substrate 38. Additionally, the plurality of half-vias 42 enables electrical interconnections between multiple semiconductor devices 36. Each semiconductor device 36 may be tested and burned-in individually.

Figure 7:
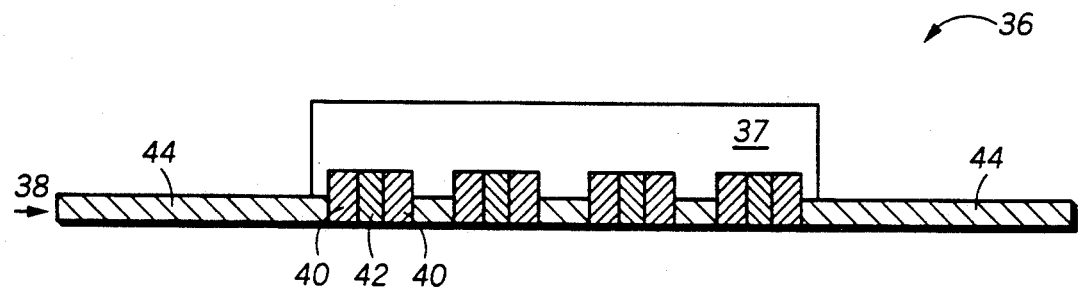
FIG. 7 is a end view of the semiconductor device of FIG. 6.

Additionally illustrated in FIG. 6 is a pair of thermally conductive extensions 44 which is an integral part of the flexible substrate 38. FIG. 7 is an end view of the semiconductor device 36 further illustrating the pair of thermally conductive extensions 44. The thermally conductive extensions 44 are actually continuous under the package body 37. A thermally conductive material such as copper can be used for these extensions. However, the metal conductors 42 need to be electrically isolated from this continuous pair of extensions.

Figure 8:
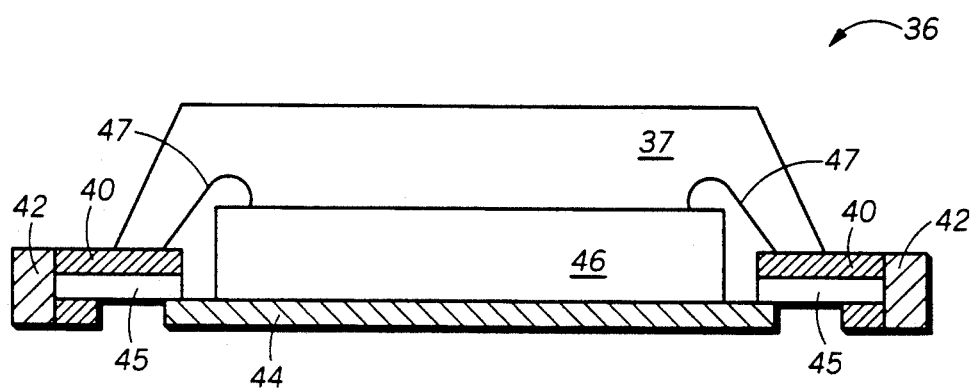
FIG. 8 is a cross-sectional view along line A—A of the overmolded semiconductor device of FIG. 6.

FIG. 8. is a cross-sectional view along line A—A of FIG. 6, illustrating how the continuous pair of thermal extensions 44 can be isolated from the metal conductors 40. A layer of electrical insulator 45 is placed between the metal conductors 40 and the continuous pair of thermal extensions 44. An advantage to this configuration is that a semiconductor die 46 can be mounted directly onto the thermally conductive material 44 for added heat dissipation. The die 46 can be electrically connected to the metal conductors 40 by a plurality of wire bonds 47.

Figure 9:
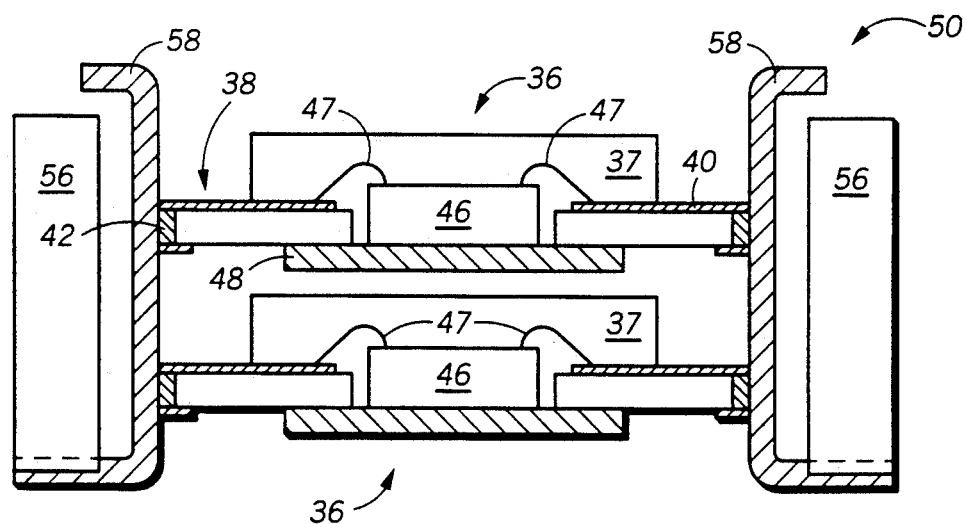
FIG. 9 is a cross-sectional view of a plurality of the overmolded semiconductor device of FIG. 6 stacked in a carrier socket, illustrating a sixth embodiment of the present invention.

FIG. 9 illustrates a sixth embodiment of the present invention showing a multiple chip module 50 composed of two semiconductor devices 36 of FIG. 6. The two devices 36, each having a semiconductor die 46 electrically coupled to the flexible substrate 38 with a plurality of wire bonds 47, are stacked above one another in a carrier socket 56 that is electrically nonconductive. Carrier socket 56 can be molded from a thermally conductive molding compound, for example, an aluminum nitride filled molding compound. Furthermore, carrier socket 56 has a plurality of spring contacts 58 which are electrical conductors to electrically interconnect the semiconductor devices 36. The plurality of spring contacts 58 is pre-molded into carrier socket 56. The two semiconductor devices 36 are self-aligning in carrier socket 56 because of the plurality of half-vias 42 formed by the metal conductors 40. The plurality of spring contacts 58 fits into the plurality of half-vias and is soldered into place, or an external clip (not shown) can be used to hold the spring contacts 58 in contact with the metal conductors 40. The multiple chip module 50 can be surface mounted to a PC board (not shown). It should be understood that each semiconductor device in the stack must be wire bonded differently and marked accordingly for either chip enable requirements or for separating data outputs per device.

Figure 10:
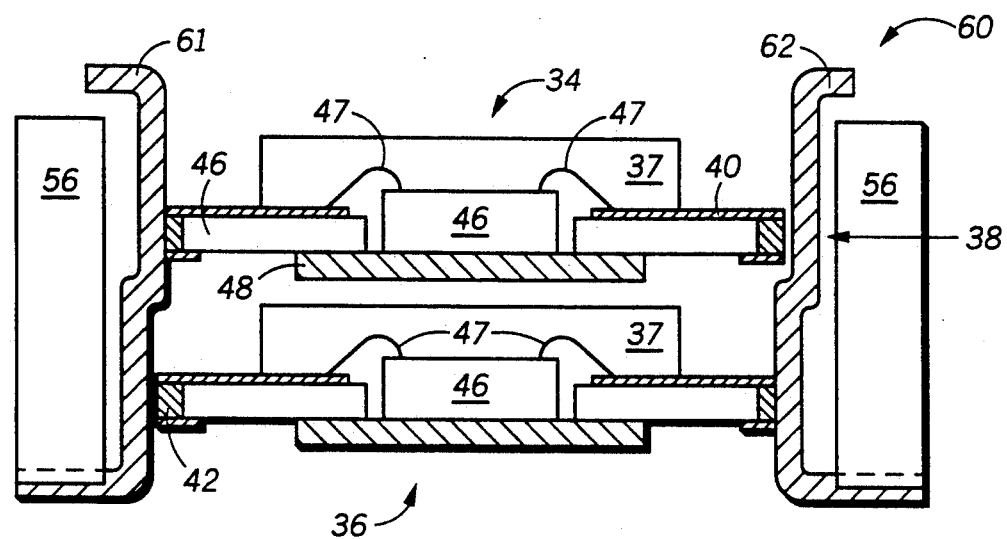
FIG. 10 is a cross-sectional view of a plurality of the overmolded semiconductor device of FIG. 6 stacked in a carrier socket with spring contacts for chip enable, illustrating a seventh embodiment of the present invention.

FIG. 10 illustrates seventh embodiment of the present invention, which allows a different chip enable scheme. A semiconductor multiple chip module 60 has substantially the same components as module 50 of FIG. 9, thus, the components are labeled the same where appropriate. A plurality of spring contacts (not fully shown) electrically interconnect the semiconductor devices 36. One spring contact 61 makes a physical and electrical connection with only the upper device, while another spring contact 62 makes a physical and electrical contact with only the lower device. This configuration allows spring contacts 61 and 62 to be used for chip enable. The remaining spring contacts connect to both the upper and lower semiconductor devices.

Figure 11:
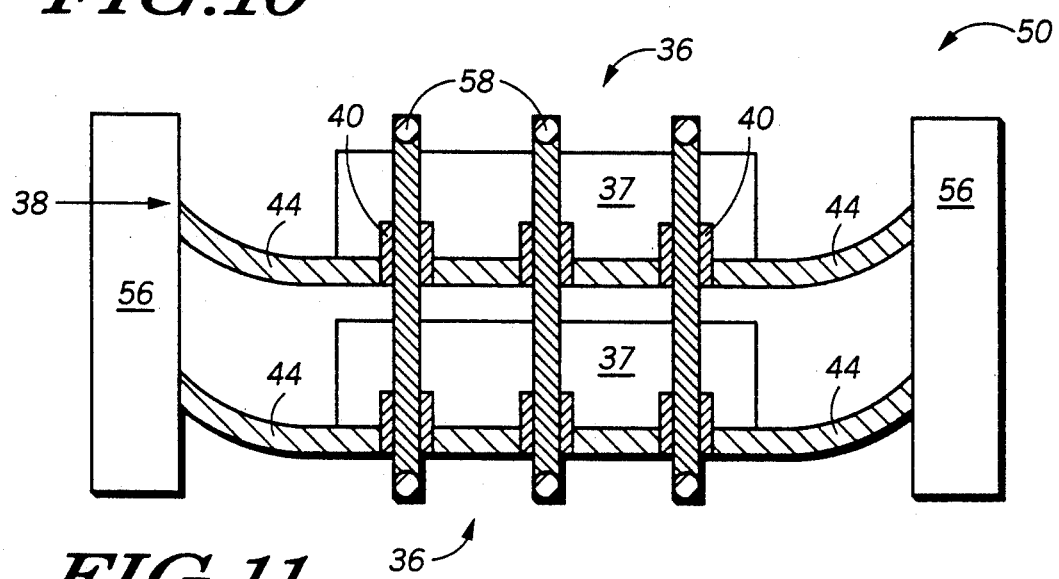
FIG. 11 is an end view of the carrier socket and stacked semiconductor devices as illustrated in FIG. 9.

FIG. 11 illustrates an end view of the multiple chip module 50. The end view for the multiple chip module 60 of FIG. 10 will look substantially the same. In this view, the pairs of thermally conductive extensions 44 are shown to touch the inner sidewalls of carrier socket 56. The flexibility of substrate 38 enables the pair of thermally conductive extensions 44 to be bent in such a manner. This configurations serves two purposes, the first one being an enhancement in the heat dissipation of the module 50. The bending of the pairs of thermally conductive extensions 44 also help to hold each semiconductor device 36 in carrier socket 56 before the plurality of spring contacts 58 are soldered into place, due to the outward force that the extensions 44 exert on the sidewalls of carrier socket 56.

Figure 12:
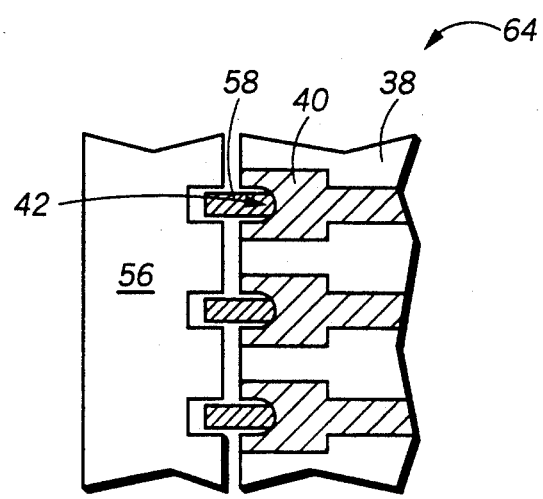
FIG. 12 is a partial top view of the carrier socket of FIG. 9 showing a plurality of spring contacts fitting into the edge half-vias of the overmolded semiconductor device of FIG. 6.

Illustrated in FIG. 12 is a partial top view 64 of carrier socket 56 with the plurality of spring contacts 58, further illustrating the method for stacking multiple semiconductor devices in a carrier socket 56 using the plurality of half-vias 42 as the self-aligning feature. The inner sidewalls of carrier socket 56 that contain the plurality of spring contacts 58 are castellated to prevent the plurality of spring contacts 58 from bending and shifting positions inside the socket 56. Furthermore, the plurality of spring contacts 58 fits into the plurality of half-vias 42 of the semiconductor device as each device is pushed inside carrier socket 56. The locations of the plurality of spring contacts 58 and the plurality of half-vias 42 ensure that each semiconductor device is properly self-aligned in the carrier socket 56.

The foregoing description and illustrations contained herein demonstrate many of the advantages associated with the present invention. The invention enables three dimensional multiple chip module that can be surface mounted to a PC board. Three dimensional packaging offers higher memory density and less required interconnect density than planar multiple chip substrates. Furthermore, it has been revealed that the configuration of this three dimensional stacked leadless multiple chip module is self-aligning. The plurality of half-vias along the castellated edges of the substrate enables the simple stacking of semiconductor devices. The fact that each substrate can be directly stacked on top of another device without any additional layers helps to minimize the overall height of the multiple chip module. The plurality of electrical conductors also aid in the heat dissipation of the module.

Thus it is apparent that there has been provided, in accordance with the invention, a three dimensional stacked leadless multiple chip module that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, a conductive plate can be added to the multiple chip module in a carrier socket to provide RF shielding in addition to enhanced thermal dissipation. In addition, the concept of the present invention can be directly applied to stacking more than two semiconductor devices to form a multiple chip module, although the descriptions only mention two devices. Furthermore, although the illustrations show only two castellated edges, it is possible that all four edges be castellated to allow four sided connections. Therefore, it is intended that this invention encompass all such variations and modifications as fall within the scope of the appended claims.

We claim:

1. A semiconductor multiple chip module comprising:
   a first PCB substrate having a top surface, a bottom surface and four edges, the first PCB substrate further having a plurality of metal conductors along at least one edge extending to the bottom surface of the first PCB substrate, the edge being castellated corresponding to the plurality of metal conductors to form a plurality of half-vias at the edge of the first PCB substrate;
   a first semiconductor die mounted and electrically connected to the first PCB substrate, wherein the first semiconductor die is protected on the first PCB substrate with an encapsulating material which adheres to the first PCB substrate forming a package body for the first semiconductor die;
   a second PCB substrate having a top surface, a bottom surface and four edges, the second PCB substrate further having a plurality of metal conductors along at least one edge extending to the bottom surface of the second PCB substrate, the edge being castellated corresponding to the plurality of metal conductors to form a plurality of half-vias at the edge of the second PCB substrate;
   a second semiconductor die mounted and electrically connected to the second PCB substrate, wherein the second semiconductor die is protected on the second PCB substrate with an encapsulating material which adheres to the second PCB substrate forming a package body for the second semiconductor die; and
   a plurality of electrical conductors which align the second PCB substrate to the first PCB substrate by fitting into the plurality of half-vias along the castellated edge of the first PCB substrate and the second PCB substrate, wherein the second PCB substrate is stacked above the first PCB substrate, the plurality of electrical conductors further being soldered to the plurality of metal conductors to electrically interconnect the first semiconductor die to the second semiconductor die, the plurality of electrical conductors also being a means for electrically connecting the semiconductor multiple chip module to a PC board.

2. The semiconductor multiple chip module according to claim 1 wherein the plurality of electrical conductors comprises a plurality of solder plated wires.

3. The semiconductor multiple chip module according to claim 1 wherein the plurality of electrical conductors comprises a plurality of solder filled springs.

4. The semiconductor multiple chip module according to claim 1 wherein the package body for both the first and second semiconductor dice is an overmolded package body comprising a resin encapsulant.

5. The semiconductor multiple chip module according to claim 1 wherein the package body for both the first and second semiconductor dice is a glob top.

6. A semiconductor device comprising:
   a thermally conductive flexible substrate having a top surface, a bottom surface, and a plurality of metal conductors on a first pair of opposing edges extending to the bottom surface, the first pair of opposing edges being castellated corresponding to the plurality of metal conductors to form a plurality of half-vias, the plurality of metal conductors being a means for electrically connecting the semiconductor device to a PC board, the flexible substrate also having a continuous pair of thermally conductive extensions formed by a second pair of opposing edges; and
   a semiconductor die mounted and electrically connected to the thermally conductive flexible substrate, wherein the semiconductor die is protected on the flexible substrate with an encapsulating material which adheres to the flexible substrate forming a package body for the semiconductor die.

7. The semiconductor device according to claim 6 wherein the package body for the semiconductor dice is an overmolded package body comprising a resin encapsulant.

8. The semiconductor device according to claim 6 wherein the package body for the semiconductor dice is a glob top.

9. A semiconductor multiple chip module comprising:
   a thermally conductive first flexible substrate having a top surface, a bottom surface, and a plurality of metal conductors on a first pair of opposing edges extending to the bottom surface, the first pair of opposing edges being castellated corresponding to the plurality of metal conductors to form a plurality of half-vias, the first flexible substrate also having a pair of thermally conductive extensions formed by a second pair of opposing edges;

a first semiconductor die mounted and electrically connected to the first flexible substrate, wherein the first semiconductor die is protected on the first flexible substrate with an encapsulating material which adheres to the first flexible substrate forming a package body for the first semiconductor die;

a thermally conductive second flexible substrate having a top surface, a bottom surface, and a plurality of metal conductors on a first pair of opposing edges extending to the bottom surface, the first pair of opposing edges being castellated corresponding to the plurality of metal conductors to form a plurality of half-vias, the second flexible substrate also having a pair of thermally conductive extensions formed by a second pair of opposing edges;

a second semiconductor die mounted and electrically connected to the second flexible substrate, wherein the second semiconductor die is protected on the second flexible substrate with an encapsulating material which adheres to the second flexible substrate forming a package body for the second semiconductor die;

a carrier socket having a plurality of electrical conductors along a first pair of opposing inner sidewalls, the plurality of electrical conductors aligning the second flexible substrate to the first flexible substrate by fitting into the plurality of half-vias along the first pair of opposing edges of the first flexible substrate and the second flexible substrate, wherein the second flexible substrate is stacked above the first flexible substrate wherein the pair of thermally conductive extensions of both the first and second flexible substrates adjoins a second pair of inner sidewalls of the carrier socket, the plurality of electrical conductors further being soldered to the plurality of metal conductors to electrically interconnect the first semiconductor die to the second semiconductor die, the plurality of electrical conductors also being a means for electrically connecting the semiconductor multiple chip module to a PC board.

10. The semiconductor multiple chip module according to claim 9 wherein the plurality of electrical conductors of the carrier socket comprises a plurality of electrically conductive spring contacts.

11. The semiconductor multiple chip module according to claim 9 wherein the package body for both the first and second semiconductor dice is an overmolded package body comprising a resin encapsulant.

12. The semiconductor multiple chip module according to claim 9 wherein the package body for both the first and second semiconductor dice is a glob top.

* * * * *